(12) United States Patent
Lai et al.

(10) Patent No.: US 9,281,557 B2
(45) Date of Patent: Mar. 8, 2016

(54) MULTI BANDWIDTH BALUN AND CIRCUIT STRUCTURE THEREOF

(71) Applicant: Siliconware Precision Industries Co., Ltd, Taichung (TW)

(72) Inventors: Chia-Chu Lai, Taichung (TW);
Min-Han Chuang, Taichung (TW);
Bo-Shiang Fang, Taichung (TW);
Ho-Chuan Lin, Taichung (TW);
Li-Fang Lin, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 201 days.

(21) Appl. No.: 14/090,787

(22) Filed: Nov. 26, 2013

(65) Prior Publication Data

US 2014/0320374 A1    Oct. 30, 2014

(30) Foreign Application Priority Data

Apr. 24, 2013    (TW) .............................. 102114568 A

(51) Int. Cl.
*H01Q 1/50*    (2006.01)
*H03H 5/00*    (2006.01)
*H03H 7/42*    (2006.01)

(52) U.S. Cl.
CPC *H01Q 1/50* (2013.01); *H03H 7/425* (2013.01)

(58) Field of Classification Search
USPC ................................ 343/821, 859; 333/25, 26
See application file for complete search history.

(56) References Cited

U.S. PATENT DOCUMENTS

| | | | |
|---|---|---|---|
| 2003/0184403 A1* | 10/2003 | Goyette et al. .................. | 333/25 |
| 2005/0116787 A1* | 6/2005 | Ohi et al. ......................... | 333/25 |
| 2009/0195324 A1* | 8/2009 | Li et al. ............................ | 333/25 |
| 2011/0001581 A1* | 1/2011 | Nishizawa et al. ........... | 333/193 |

* cited by examiner

*Primary Examiner* — Tan Ho
(74) *Attorney, Agent, or Firm* — Mintz Levin Cohn Ferris Glovsky and Popeo, P.C.; Peter F. Corless; Steven M. Jensen

(57) ABSTRACT

A multi bandwidth balun is provided, including a main signal port, a main inductor electrically connected to the main signal port, a first inductor inducted mutually with the main inductor to constitute a first inductor of a first conversion circuit, a first capacitor module connected in parallel to the first conversion circuit, two first signal ports electrically connected to the first capacitor module, a first main capacitor electrically connected to the first signal port and the first capacitor module therebetween, a second inductor inducted mutually with the main inductor to constitute a second inductor of a second conversion circuit, a second capacitor module connected in parallel to the second conversion circuit, two second signal ports electrically connected to the second capacitor module, and a second main capacitor electrically connected to the second signal port and the second capacitor module therebetween.

30 Claims, 13 Drawing Sheets

MULTI BANDWIDTH BALUN AND CIRCUIT STRUCTURE THEREOF

CROSS-REFERENCES TO RELATED APPLICATIONS

This application claims under 35 U.S.C. §119(a) the benefit of Taiwanese Application No. 102114568, filed Apr. 24, 2013, the entire contents of which is incorporated herein by reference.

BACKGROUND OF THE INVENTION

1. Field of the Invention

The present invention relates to balance-to-unbalances (baluns), and, more particularly, to a multi bandwidth balun and a circuit structure thereof.

2. Description of Related Art

With the advance of communication technology, nowadays a wireless communication system requires a radio frequency (RF) device operated under multiple frequency band. For example, a balun is an essential circuit element in multi bandwidth communication system and multifunction system. The balun converts the signal from an unbalance state into a balance state between an unbalanced port connected to an antenna and a balanced port connected to an impedance load, and matches the impedances. In general, the balun is constituted by two opposite coils with the same polarity.

FIGS. 1A and 1B illustrate a circuit diagram and a top view of the circuit structure thereof of a balun 1 according to the prior art, respectively.

As shown in FIGS. 1A and 1B, the balun 1 is achieved via forming a balun structure operated in two RF bandwidths on a semiconductor base layer by a semiconductor manufacturing technique. That is, the circuit structure 1' is disposed on the surface of a base layer 1a having a ground port, and the circuit structure 1' has a plurality of conductive pads 14.

The balun 1 comprises two main signal ports 17a and 17b, a first main inductor 10a electrically connected to the main signal port 17a, a second main inductor 10b electrically connected to the main signal port 17b, two additional conductors 170 connected in parallel to the first main inductor 10a and the second main inductor 10b, respectively, a first inductor 11a electrically connected to the first main inductor 10a to constitute a first conversion circuit 15a, a second inductor 11b electrically connected to the second main inductor 10b to constitute a second conversion circuit 15b, a first capacitor 12a connected in parallel to the first conversion circuit 15a, a second capacitor 12b connected in parallel to the second conversion circuit 15b, two first signal ports 18a and 18b electrically connected to the first capacitor 12a, and two second signal ports 19a and 19b electrically connected to the second capacitor 12b.

The main signal ports 17a and 17b are unbalanced signal transmission ports. The first signal ports 18a and 18b and the second signal ports 19a and 19b are balanced signal transmission ports.

However, in the multi bandwidth balun 1 according to the prior art, due to the design of two sets of electrical matching network, the circuit structure 1' has more elements. The increased number of unbalanced signal transmission ports results in the higher cost of material and manufacturing, and additional switch circuits are required to achieve the function of the balun 1.

Moreover, the circuit structure 1' is formed on the same surface of a base layer 1a, such that the circuit structure 1' takes a great portion of the area of the surface of the base layer 1a, and thereby can hardly reduce the length and width off a semiconductor element. In particular, forming two main signal ports 17a and 17b makes the circuit arrangement area of the semiconductor element even harder to be reduced. Therefore, electronic products do not meet the requirement of minimization.

Thus, how to overcome various problems in the prior art is substantially an issue desired to be solved.

SUMMARY OF THE INVENTION

According to the above drawbacks of the prior art, the present invention provides a multi bandwidth balun, comprising a main signal port, a main inductor electrically connected to the main signal port, a first inductor inducted mutually with the main inductor to constitute a first conversion circuit, a first capacitor module connected in parallel to the first conversion circuit, two first signal ports electrically connected to the first capacitor module, a first main capacitor electrically connected to the first signal port and the first capacitor module therebetween, a second inductor inducted mutually with the main inductor to constitute a second conversion circuit, a second capacitor module connected in parallel to the second conversion circuit, two second signal ports electrically connected to the second capacitor module, and a second main capacitor electrically connected to the second signal port and the second capacitor module therebetween.

The present invention also provides a circuit structure of multi bandwidth balun, comprising: a first circuit layer, including a first capacitor module, a first main capacitor, a second capacitor module and a second main capacitor; and a second circuit layer disposed on the first circuit layer, the second circuit layer including: a first main signal port; a main inductor electrically connected to the main signal port; a first inductor inducted mutually with the main inductor to constitute a first conversion circuit parallel to the first capacitor module; two first signal ports electrically connected the first capacitor module, wherein the first main capacitor is electrically connected to the first signal port and the first capacitor module therebetween; a second inductor inducted mutually with the main inductor to constitute a second conversion circuit connected in parallel to the second capacitor module; and two second signal ports electrically connected the second capacitor module, wherein the second main capacitor is electrically connected to the second signal port and the second capacitor module therebetween.

In an embodiment, the main inductor is constituted by a first coil, an extension portion and a second coil, and the extension portion is connected to the first and second coils. For example, the first circuit layer further includes the extension portion, and the second circuit layer further includes the first coil and the second coil. Moreover, the second circuit layer has conductive vias that electrically connect the first coil and the extension portion thereof and electrically connect the second coil and the extension portion thereof.

In an embodiment, the circuit structure further comprises a plurality of conductive vias that connect the first circuit layer and the second circuit layer, and the conductive vias electrically connect the first inductor to the first capacitor module and electrically connect the second inductor to the second capacitor module.

In an embodiment, the circuit structure further comprises a base layer carrying the first circuit layer, the base layer has a plurality of electrodes corresponding to the main signal port, the first capacitor module, the second capacitor module, the first main capacitor, the second main capacitor, the first signal port, and the second signal port. The circuit structure yet further comprises conductive through holes that connect the base layer and first circuit layer, and the conductive through holes electrically connect the electrodes to the main signal port, electrically connect the electrodes to the first signal port, and electrically connect the electrodes to the second signal port.

In an embodiment, the main signal port is an input port, and the first signal port and the second signal port are output ports. Alternately, the main signal port is an output port, and the first signal port and the second signal port are input ports.

In an embodiment, an impedance load is connected between the two first signal ports. Alternately, an impedance load is connected between the two second signal ports.

In an embodiment, the balun and the circuit structure thereof further comprise a ground port connected to the main inductor, the first inductor, the first capacitor module, the second inductor and the second capacitor module.

In an embodiment, the balun and the circuit structure thereof further comprise a third inductor inducted mutually with the main inductor to constitute a third conversion circuit; a third capacitor module connected in parallel to the third conversion circuit; two third signal ports electrically connects to the third capacitor module; and a third main capacitor electrically connected to the third signal port and the third capacitor module therebetween. For example, the first circuit layer further comprises a third capacitor module and a third main capacitor, and the second circuit layer further includes a third inductor and two third signal ports. Moreover, the main inductor is constituted by a first coil, an extension portion, a second coil and a third coil. The extension portion connects the first coil and the third coil, and the second coil is integrated with the third coil. Further, the first circuit layer further comprises the extension portion, and the second circuit layer further comprises the first coil, the second coil and the third coil.

In addition, the present invention further provides a wireless network system, comprising an antenna; a radio frequency (RF) converter electrically connected to the antenna; a signal transmitting terminal electrically connected to the RF converter; a signal receiving terminal electrically connected to the RF converter; a filter electrically connected between the RF converter and the signal transmitting terminal and electrically connected between the RF converter and the signal receiving terminal; and the balun electrically connected between the filter and the signal transmitting terminal and electrically connected between the filter and the signal receiving terminal, wherein the main signal port is electrically connected to the filter, and the first signal port and the second signal port (and the third signal port) are electrically connected to the signal transmitting terminal and the signal receiving terminal.

From the above, the multi bandwidth balun and the circuit structure thereof according the present invention only need to design a main inductor because two inductors are mutually inducted in a close distance. Thus, compared the prior art that has two main inductors, the present invention uses one main inductor only, and does not need to form two sets of electrically matched networks, as did in the prior art. Therefore, passive elements, such as capacitors and inductors, may be disposed in different circuit layers, so as to reduce the area of a base layer surface taken by the circuit structure of the balun, and reduce the volume of a semiconductor component.

DETAILED DESCRIPTION OF THE INVENTION

The following illustrative embodiments are provided to illustrate the disclosure of the present invention, these and other advantages and effects can be apparently understood by those in the art after reading the disclosure of this specification.

It should be advised that the structure, ratio, and size as illustrated in this context are only used for disclosures of this specification, provided for persons skilled in the art to understand and read, and technically do not have substantial meaning. Any modification of the structure, change of the ratio relation, or adjustment of the size should be involved in the scope of disclosures in this specification without influencing the producible efficacy and the achievable objective of this specification. Also, the referred terms such as "on", "first", "second", "third", "main", "additional" and "one" in this specification are only for the convenience to describe, not for limiting the scope of embodiment in the present invention. Those changes or adjustments of relative relationship without substantial change of technical content should also be considered within the category of implementation.

Figure 1A:
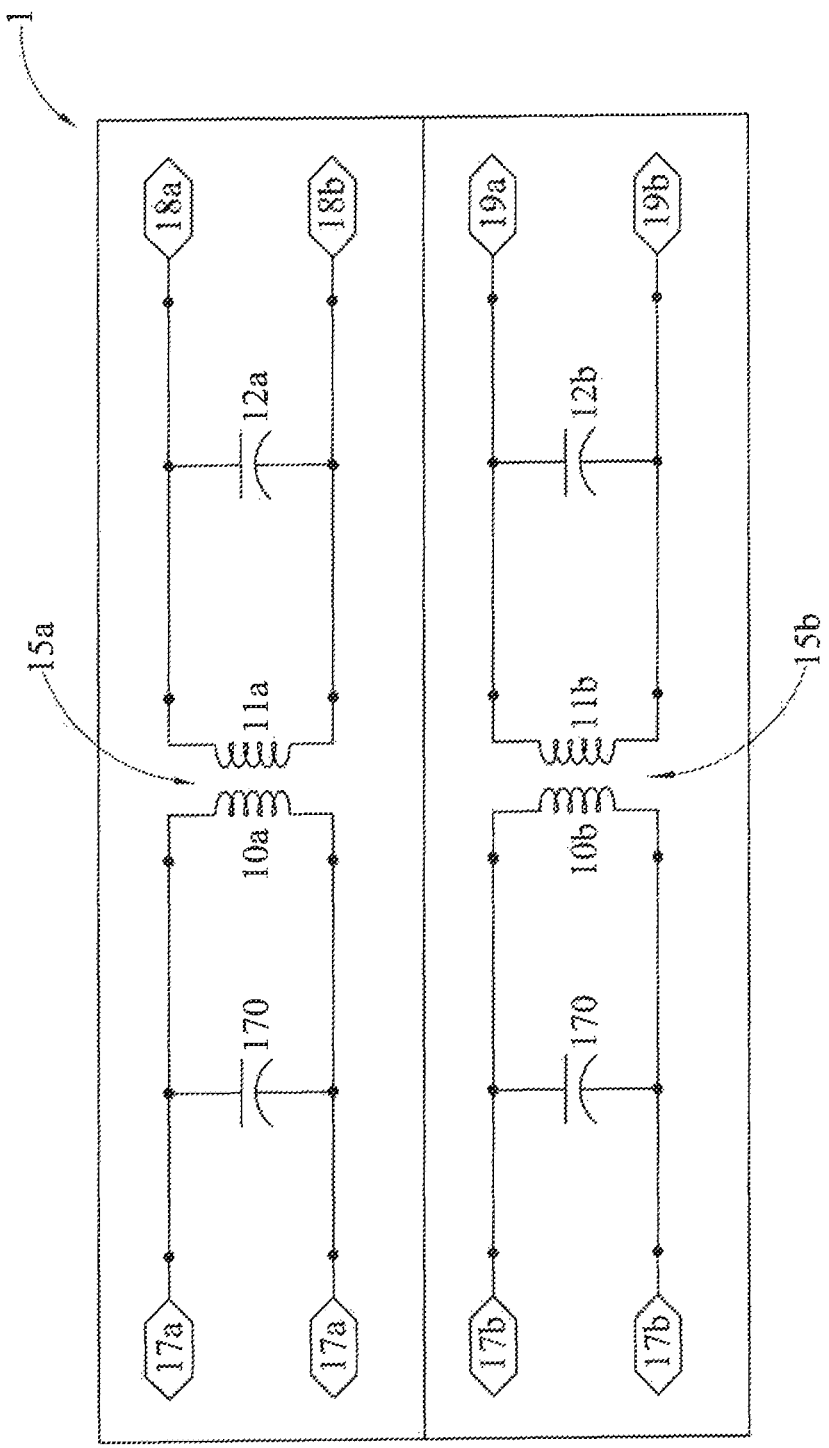
FIG. 1A is a circuit diagram of a multi bandwidth balun according to the prior art.
Figure 1B:
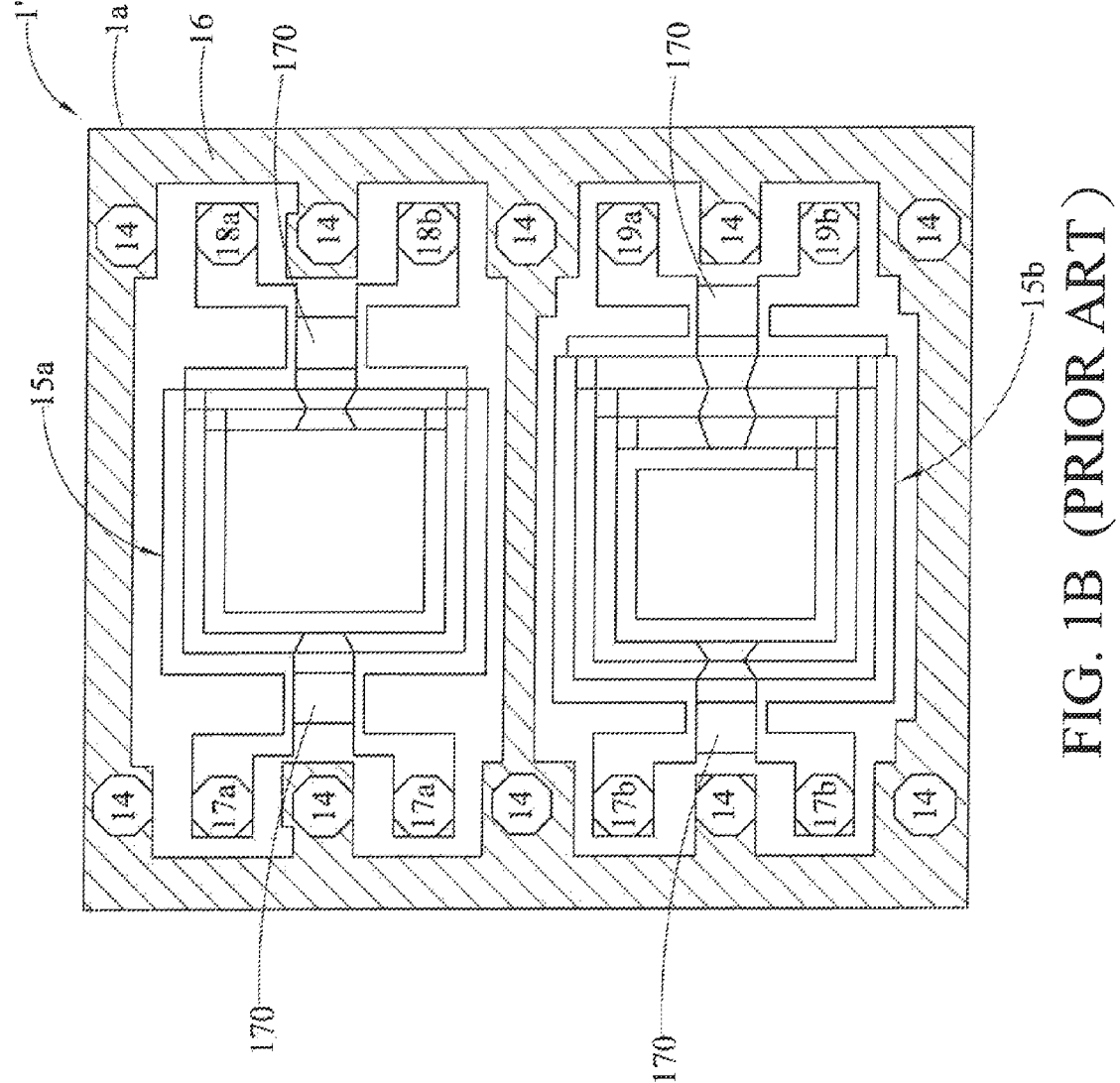
FIG. 1B is a top view of a circuit structure of a multi bandwidth balun according to the prior art.
Figure 2:
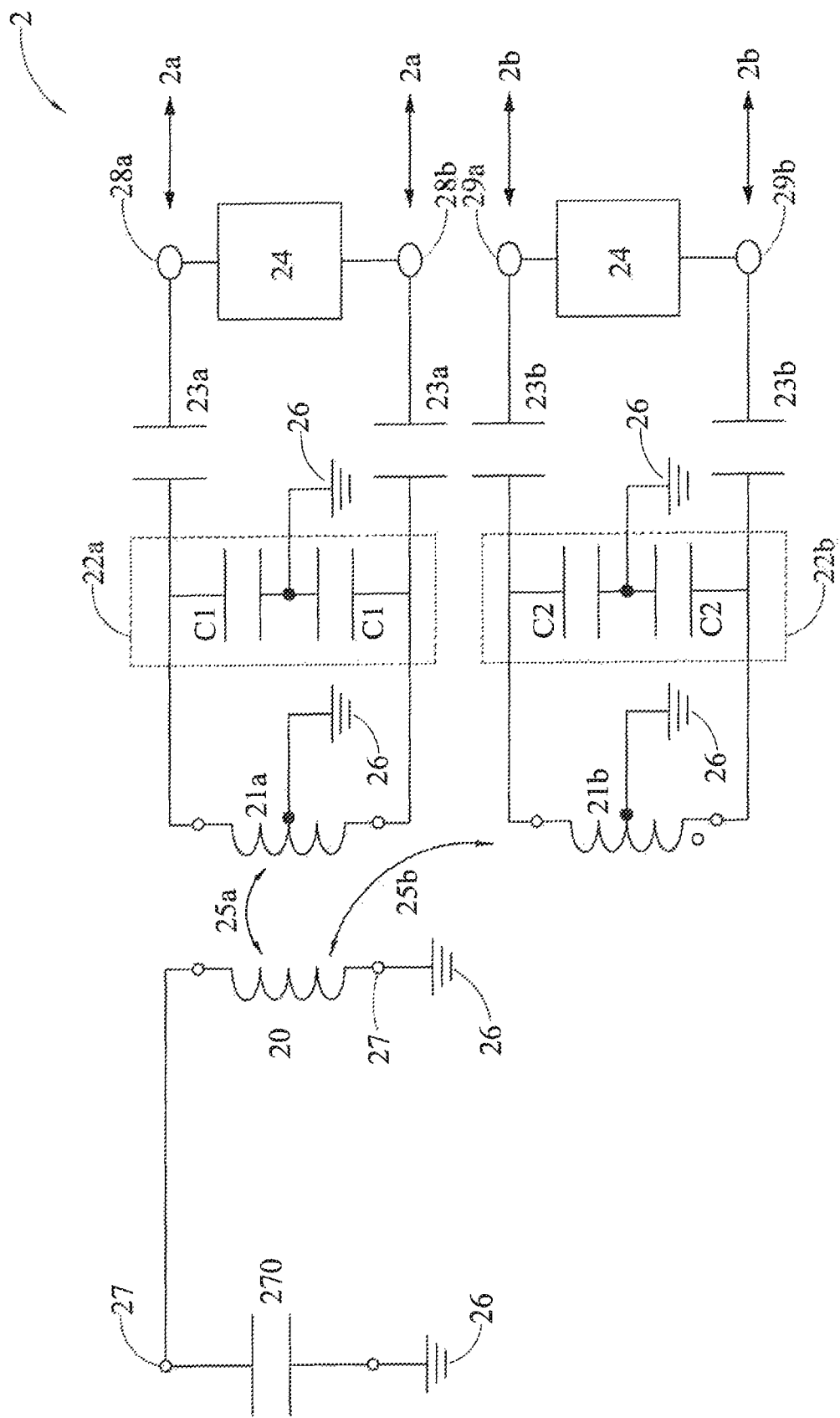
FIG. 2 is a circuit diagram of a multi bandwidth balun according to the present invention.

FIG. 2 is a schematic diagram of a circuit of a multi bandwidth balun 2 according to the present invention. As shown in FIG. 2, the balun 2 comprises a main signal port 27, two first signal ports 28a and 28b, two second signal ports 29a and 29b, a main inductor 20, a first inductor 21a, a first capacitor module 22a, a first main capacitors 23a, a second inductor 21b, a second capacitor module 22b, and a second main capacitor 23b.

In an embodiment, the balun 2 has a low frequency conversion path 2a (the main inductor 20, the first inductor 21a, the first capacitor module 22a and the first main capacitors 23a) and a high frequency conversion path 2b (the main inductor 20, the second inductor 21b, the second capacitor module 22b and the second main capacitor 23b).

The main signal port 27 is an unbalanced signal transmitting port, with one end connected to an additional capacitor 270 and the other end connected to a ground port 26.

The main inductor 20 is electrically connected to the main signal port 27.

The first inductor 21a and the main inductor 20 are mutually inducted to constitute a first conversion circuit 25a.

The first capacitor module 22a is connected in parallel to the first conversion circuit 25a, and the first capacitor module 22a is composed of two first capacitors C1 connected in series.

The first signal ports 28a and 28b are balanced signal transmitting ports at low frequencies, and are electrically connected to the first capacitor module 22a, and an impedance load 24 is connected between the two first signal ports 28a and 28b.

In an embodiment, the balun 2 has two first main capacitors 23a, one of which is electrically connected between the first signal ports 28a and the first capacitor module 22a, and the other of which is electrically connected between the first signal port 28b and the first capacitor module 22a.

The second inductor 21b and the main capacitor 20 are mutually inducted to constitute a second conversion circuit 25b.

The second capacitor module 22b is connected in parallel to the second conversion circuit 25b, and the second capacitor module 22b is composed of two second capacitors C2 in series.

The second signal ports 29a and 29b are balanced transmitting ports at high frequencies, and are electrically connected to the second capacitor module 22b, and an impedance load 24 is connected between the two second signal ports 29a and 29b.

In an embodiment, the balun 2 has two second main capacitors 23b, one of which is electrically connected between the second signal ports 29a and the second capacitor module 22b, and the other of which is electrically connected between the second signal port 29b and the second capacitor module 22b.

In an embodiment, a mutual inductance is generated when two inductors are close within a certain distance. By the design of the mutual inductance, only a main inductance 20 is required to induce the first and second inductors 21a and 21b without forming two main inductors. In other words, the first and second conversion circuits 25a and 25b share a main inductor 20.

Moreover, the main signal port 27 is an input port, and the first and second signal ports 28a, 28b, 29a and 29b are output ports. In another embodiment, the main signal port 27 is an output port, and the first and second signal ports 28a, 28b, 29a and 29b are input ports.

Further, the number of first main capacitors 23a disposed between the first signal ports 28a and 28b and the first capacitor module 22a depends on the application need, and is not limited to one. Also, the number of second main capacitors 23b disposed between the second signal ports 29a and 29b and the second capacitor module 22b depends on the need, and is not limited to one.

In addition, the balun 2 further comprises a ground port 26 connected to the main inductor 20, the first and second inductors 21a and 21b and the first and second capacitor modules 22a and 22b.

A balun 2 is shown in FIG. 2, wherein each reference value of the capacitors and inductors is shown at table 1.

TABLE 1

| Element | Inductance | Capacitance |
| --- | --- | --- |
| Main inductor 20 | 2.137 nH | |
| First inductor 21a | 1.505 nH | |

TABLE 1-continued

| Element | Inductance | Capacitance |
| --- | --- | --- |
| Second inductor 21b | 1.285 nH | |
| First capacitor C1 | | 5.24 pF |
| First main capacitor 23a | | 1.134 pF |
| Second capacitor C2 | | 2.85 pF |
| Second main capacitor 23b | | 2.706 pF |

Figure 5:
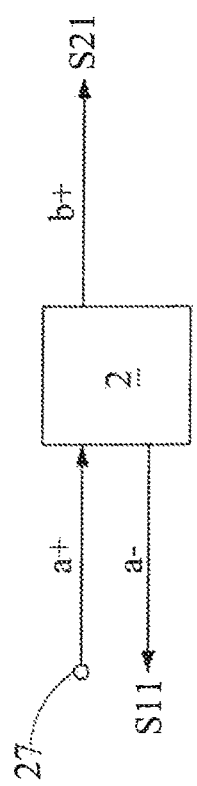
FIG. 5 is a diagram of the working principle of a balun.

FIG. 5 illustrates the working principle of a balun. As shown in FIG. 5, one of the transmitting path (low frequency) of FIG. 2 is applied for illustration, wherein "a+" indicates the incidence power, "a−" indicates the reflection power, "b+" indicates the transmission power, S11 indicates the return loss, S21 indicates the insertion loss, and S11 =10 log [a−/a+] and S21=10 log [b+/a+].

The balun 2 according to the present invention allows a great return loss S11 and a small insertion loss S21 of the signal frequency within the bandwidth. Once passing through a balun (from an unbalanced signal port to a balance signal port), a signal within the bandwidth is converted into two differential signals within the bandwidth. Therefore, the amplitude and phase difference of the two signals can be observed. FIG. 6A is a comparison diagram of bandwidth B and return loss S11 versus frequency between two differential signals of the low frequency conversion path in FIG. 2. As shown in FIG. 6A, wherein one differential signal m1 has the frequency 2.400 GHz, bandwidth 0.712, amplitude of return loss S11 13.104; and the other differential signal m2 has the frequency 2.500 GHz, bandwidth 0.764, amplitude of return loss S11 12.509.

Figure 6B:
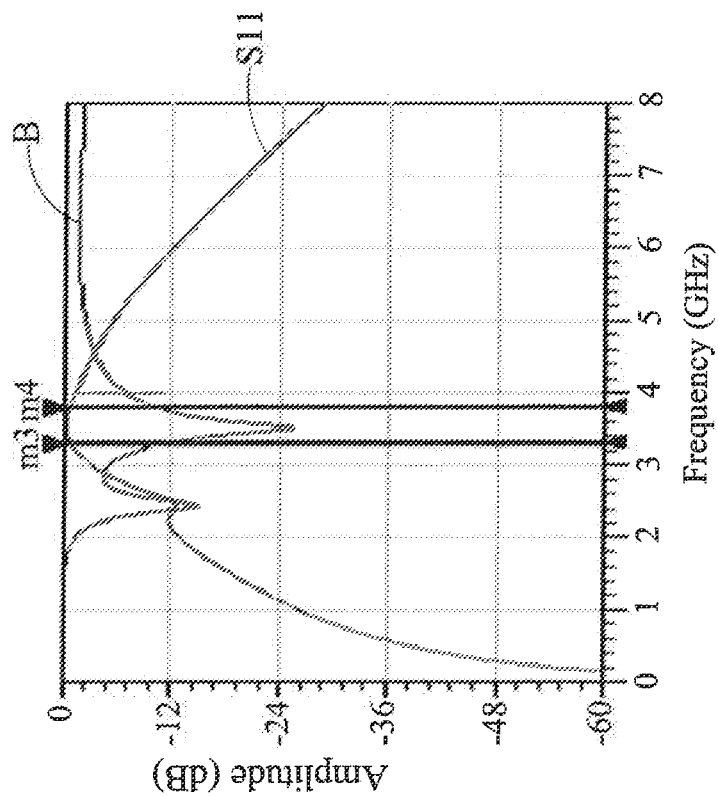
FIGS. 6A and 6B are comparison diagrams of the bandwidth and return loss versus frequency between two differential signals according to the present invention.
Figure 6A:
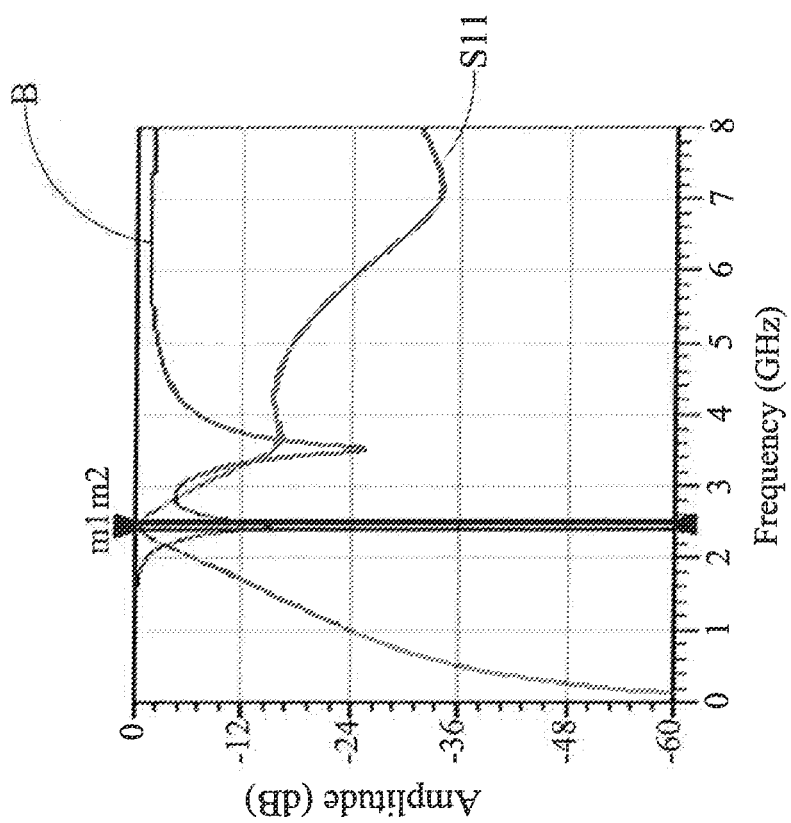

FIG. 6B is a comparison diagram of bandwidth B and return loss S11 versus frequency between two differential signals of the high frequency conversion path in FIG. 2. As shown in FIG. 6B, wherein one differential signal m3 has the frequency 3.300 GHz, bandwidth 0.827, amplitude of return loss S11 as 11.162; and the other differential signal m4 has the frequency 3.800 GHz, bandwidth 0.722, amplitude of return loss S11 as 10.403.

Figure 6D:
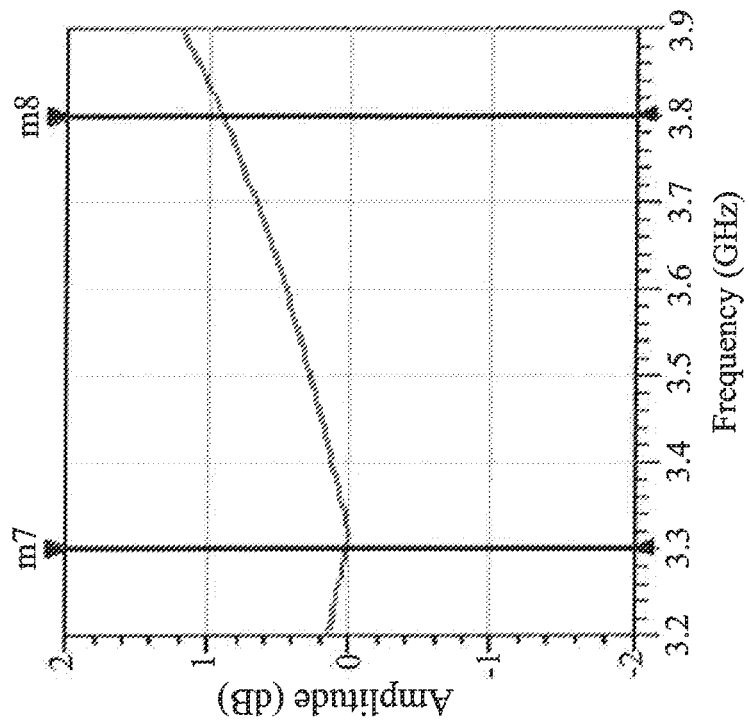
FIGS. 6C and 6D are diagrams of amplitude imbalance for differential signal amplitude difference at low and high frequency bandwidths respectively according to the present invention.
Figure 6C:
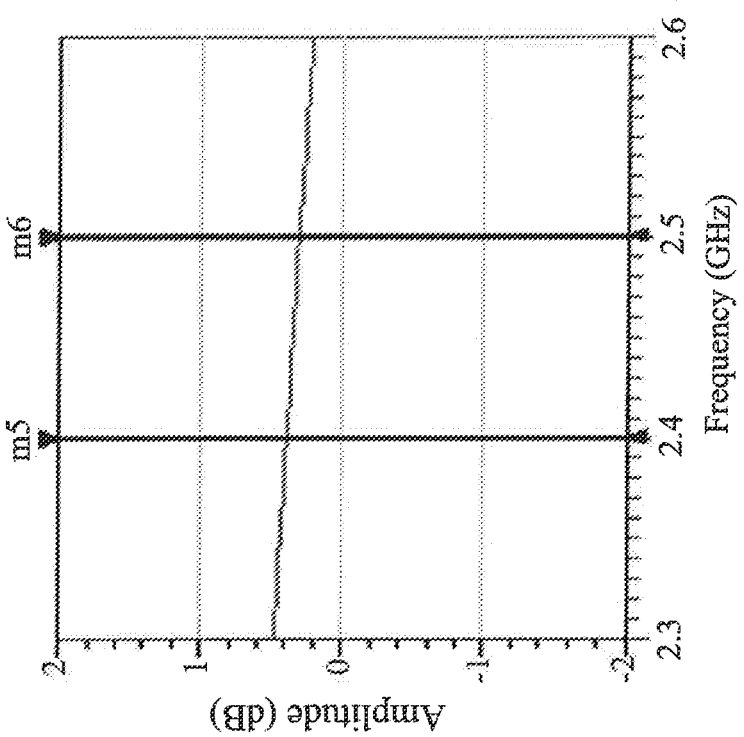

FIG. 6C is a comparison diagram of amplitude imbalance between two differential signals of the low frequency conversion path in FIG. 2. The amplitude imbalance is the amplitude difference at a balance signal port between two differential signals. As shown in FIG. 6C, one differential signal m5 has an amplitude 0.390 at frequency 2.400 GHz and, and the other differential signal m6 has an amplitude 0.304 at frequency 2.500 GHz.

FIG. 6D is a comparison diagram of amplitude imbalance between two differential signals of the high frequency conversion path in FIG. 2. As shown in FIG. 6D, one differential signal m7 has an amplitude 0.017 at frequency 3.300 GHz and, and the other differential signal m8 has an amplitude 0.914 at frequency 3.800 GHz.

Figure 6F:
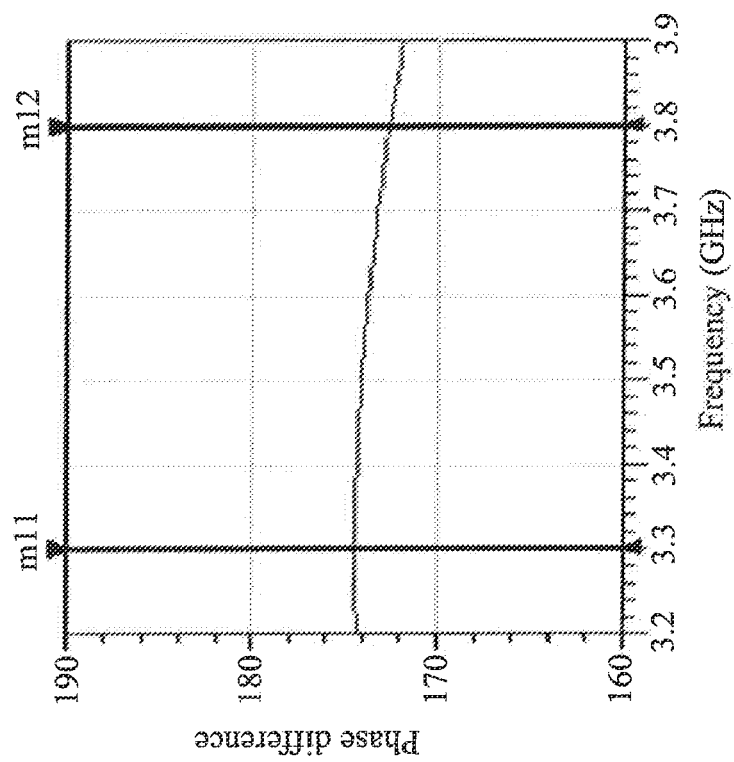
FIGS. 6E and 6F are diagrams of phase difference imbalance for differential signal phase difference at low and high frequency bandwidths respectively according to the present invention.
Figure 6E:
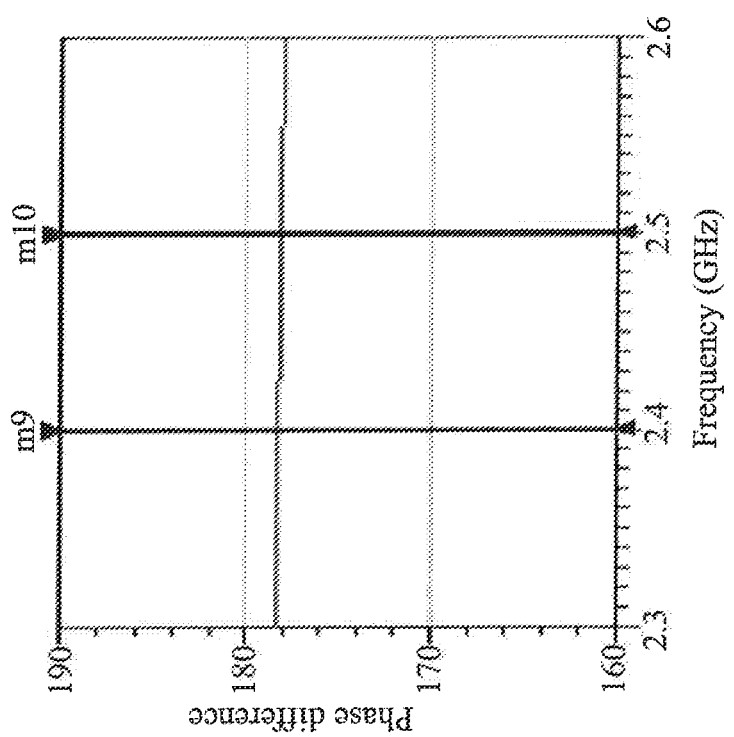

FIG. 6E is a comparison diagram of phase imbalance between two differential signals of the low frequency conversion path in FIG. 2. The phase imbalance is the phase difference at a balance signal port between two differential signals. As shown in FIG. 6E, one of the differential signal m9 has a phase difference 178.216 degree at frequency 2.400 GHz and, and the other differential signal m10 has a phase difference 178.111 degree at frequency 2.500 GHz.

FIG. 6E is a comparison diagram of phase imbalance between two differential signals of the high frequency conversion path in FIG. 2. As shown in FIG. 6F, one of the differential signal m11 has a phase difference 174.441 degree at frequency 3.300 GHz and, and the other differential signal m12 has a phase difference 172.659 degree at frequency 3.800 GHz.

From the above, the maximum amplitude of FIG. 6C is 0.5 dB, the maximum amplitude of FIG. 6D is 1.2 dB, the maximum phase difference of FIG. 6E is 178 degree, and the maximum phase difference of FIG. 6F is 174 degree. All of the amplitudes and phase differences are less than the maximum of amplitude imbalance 2 dB and the maximum of phase imbalance 180±10 degree. Therefore, the balance signal port of balun 2 generates the desired balance differential signal at the frequencies 2.4-2.5 GHz and 3.3-3.8 GHz.

Figure 3A:
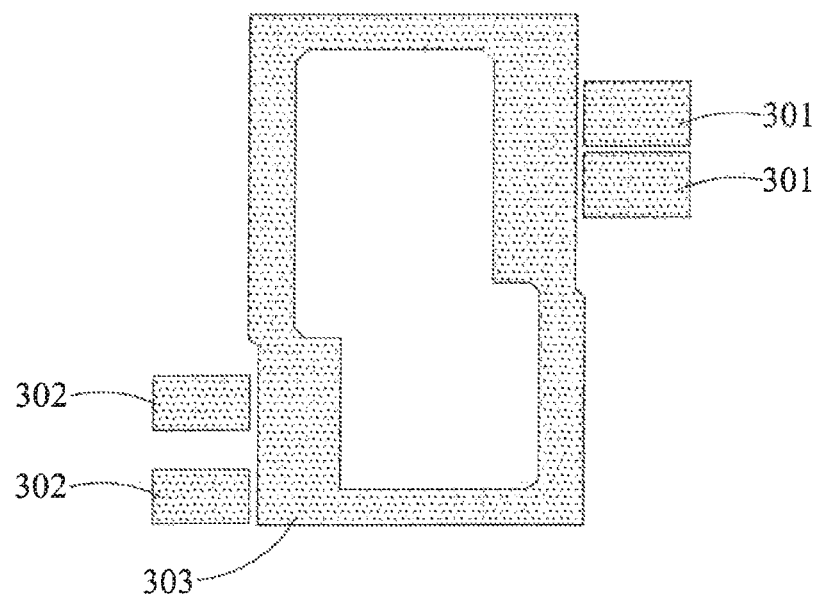
FIGS. 3A-3E are top views illustrating a manufacturing method of the circuit structure of a multi bandwidth balun according to the present invention, and FIG. 3E' is a cross-sectional view of FIG. 3E.
Figure 3B:
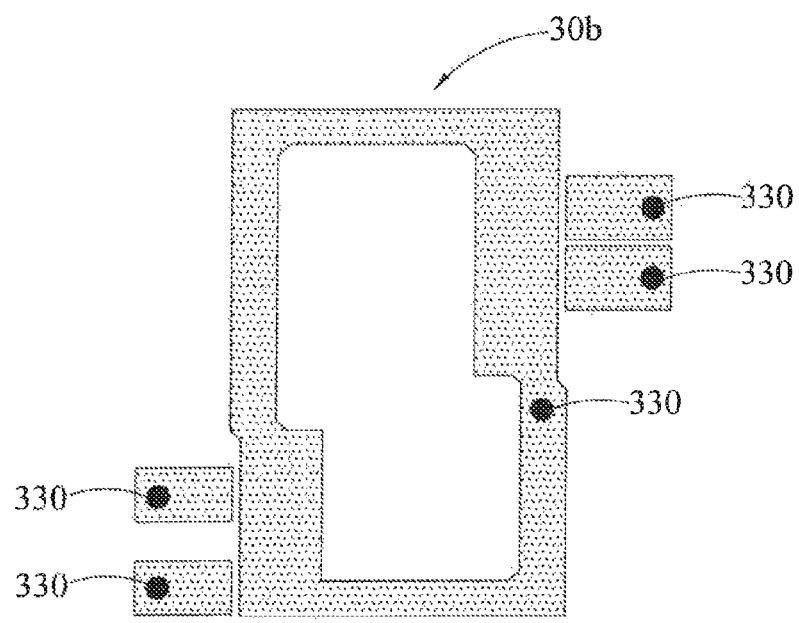
Figure 3C:
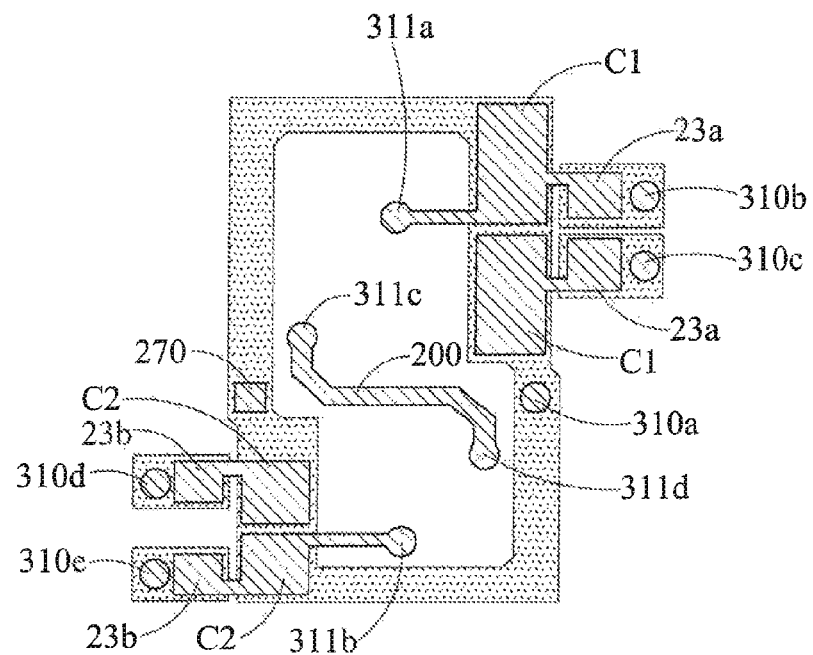
Figure 3D:
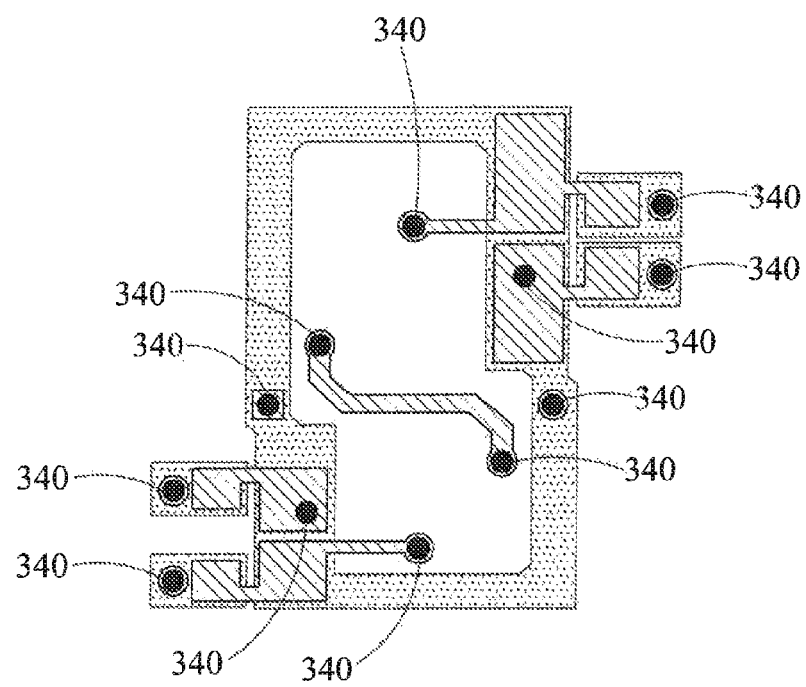
Figure 3E:
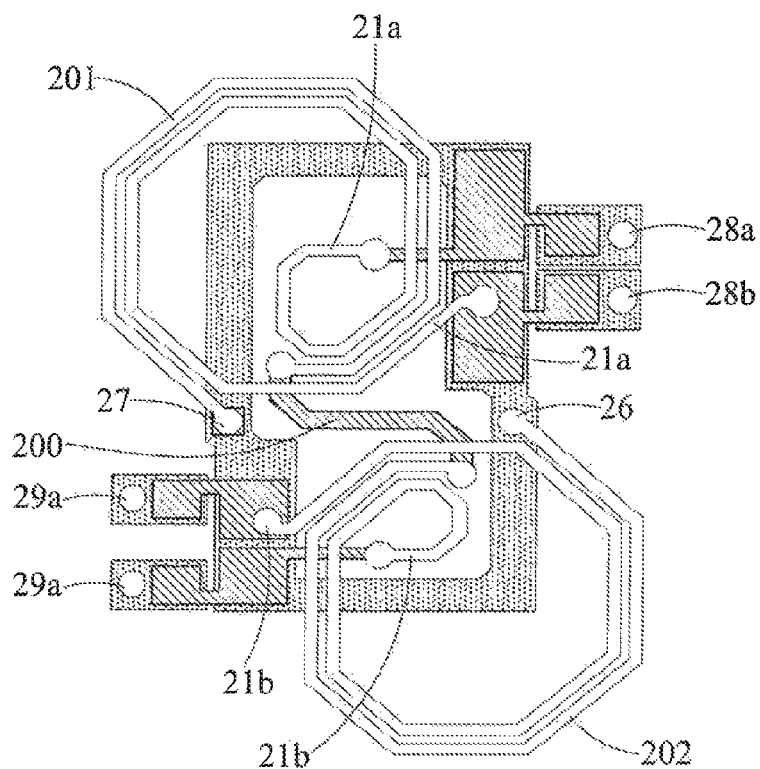
Figure 3E:
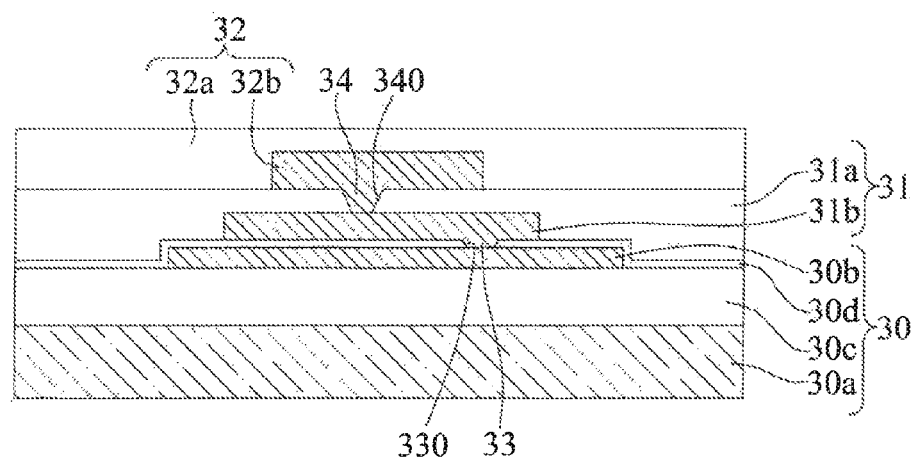

FIGS. 3A-3E are top views illustrating a manufacturing method of the circuit structure of a multi bandwidth balun 2 according to the present invention, and FIG. 3E' is a cross-sectional view of FIG. 3E.

As shown in FIGS. 3A and 3E', a silicon wafer 30a is provided, and a dielectric layer 30c such as PolyBenzobis Oxazole (PBO) is formed on the silicon wafer 30a by a coating method. A lithographic process is subsequently performed to form a plurality of electrodes 30b on the dielectric 30c, and then a passivation layer 30d such as silicon nitride is formed on the dielectric 30c and the electrodes 30b by a chemical vapor deposition (CVD) method to form a base layer 30.

In an embodiment, the electrodes 30b are copper electrodes, and it is distinguished as two first common electrodes 301, two second common electrodes 302 and a third common electrode 303.

As shown in FIGS. 3B and 3E', vias 330 are formed on the passivation layer 30d to expose a portion of the electrodes 30b.

As shown in FIGS. 3C and 3E', a first circuit layer 31 is formed on the base layer 30, and conductive through holes 33 are formed in the vias 330.

In an embodiment, the first circuit layer 31 is constituted by a dielectric 31a such as PBO and a first patterned circuit 31b. The first patterned circuit 31b is formed on the passivation layer 30d and includes a plurality of conductive pads 310a-310e, an additional capacitor 270, an extension portion 200, a first capacitor module 22a (two first capacitors C1), two first main capacitors 23a, a second capacitor module 22b (two second capacitors C2) and two second main capacitors 23b, wherein two ends of the extension 200, one of the first capacitor C1 and one of the second capacitors C2 have transfer pads 311a-311d.

Moreover, a first common electrode 301 corresponds to the first main capacitor 23a, a second common electrode 302 corresponds to the second main capacitor 23b, and a third common electrode 303 corresponds to the additional capacitors 270, the first capacitor module (two first capacitors C1), and the second capacitor module 22b (two second capacitors C2).

Further, the conductive through holes 33 connect the base layer 30 and first circuit layer 31, and the conductive through holes 33 are electrically connected to the electrode 30b and the conductive pads 310a-310e.

As shown in FIGS. 3D and 3E', a plurality of vias 340 are formed on the dielectric 31a to expose the additional capacitor 270, one of the first capacitors C1 (without transfer pad 3111a), one of the second capacitors C2 (without transfer pad 311b), the conductive pads 301a-310e and the transfer pads 311a-311d.

As shown in FIGS. 3E and 3E', a second circuit layer 32 is formed on the first circuit layer 31, and the conductive vias 34 are formed in those vias 340.

In an embodiment, the second circuit layer 32 is constituted by a dielectric 32a such as PBO and the second patterned circuit 32b. The second patterned circuit 32b includes a first coil 201, a second coil 202, a main signal port 27, a first inductor 21a, two first signal ports 28a and 28b, a second inductor 21b, and two second signal ports 29a and 29b, wherein the main inductor 20 is constituted by the first coil 201, the extension portion 200 and the second coil 202, one end of the first coil 201 is a main signal port 27, and one end of the second coil 202 is a ground port 26 of the main signal port 27.

Moreover, the conductive vias 34 connect the first circuit layer 31 and second circuit layer 32, such that two ends of the first inductor 21a are electrically connected through conductive vias 34 to the first capacitor C1 and the transfer pad 311a, respectively, and two ends of the second inductor 21b are electrically connected through conductive vias 34 to the second capacitor C2 and transfer pad 311b, respectively.

Further, two ends of the first coil 201 are electrically connected through conductive vias 34 to the additional capacitor 270 (at the main signal port 27) and the transfer pad 311c of the extension portion 200, respectively, and two ends of the second coil 202 are electrically connected through conductive vias 34 to the conductive pad 310a (the end is utilized as a ground port 26) and the transfer pad 311d of the extension portion 200, respectively.

In addition, the conductive vias 34 are electrically connected to the two first signal ports 28a and 28b and the conductive pads 310b and 310c, and two second signal ports 29a and 29b and the conductive pads 310d and 310e.

A via is formed on the dielectric 32a of the second circuit layer 32 to expose the main signal port 27, the first signal ports 28a and 28b, the second signal ports 29a and 29b and the ground port 26. Subsequently, conductive elements are disposed on the exposed portion (not illustrated) for externally connecting to other electronic elements (not illustrated).

Main elements arrangement of the circuit structure of a balun 2 according to the present invention is shown in table 2.

TABLE 2

|  | Low frequency conversion and balanced signal terminal | Main inductor and unbalanced signal terminal | High frequency conversion and balanced signal terminal |
| --- | --- | --- | --- |
| Second circuit layer | 21a, 28a, 28b | 201, 202, 27 | 21b, 29a, 29b |
| First circuit layer | 22a, 23a | 200, 270 | 22b, 23b |
| Base layer | Common electrodes corresponding to each capacitors | | |

A balun 2 according to the present invention utilizes integrated passive devices (IPD) multi layers stacking technology to arrange passive devices, such as capacitors and inductors, in a stacked circuit structure, such that the capacitors and inductors are disposed in different circuit layers, so as to conform the thinness requirement of electronic devices, and the mutual inductance is generated when two inductors are close within a certain distance. Therefore, the balun 2 is designed by mutual inductance without forming an electrically matched network according to the prior art. Thus, the capacitors and inductors are not necessarily formed on the same circuit layer, such that reducing the area taken by the surface of each dielectric 30c, 31a and 32a of the circuit structure of the balun 2. The length and width of a semiconductor element is thereby reduced so as to meet the minimization requirement of electronic products.

Moreover, the balun 2 is designed by mutual inductance and only needs to design a main inductor 20. Thus, compared with the prior art, the present invention reduce one main inductor to reduce not only the cost but also the circuit arrangement area and volume of semiconductor such that electronic products may further meet the minimization requirement.

Figure 4A:
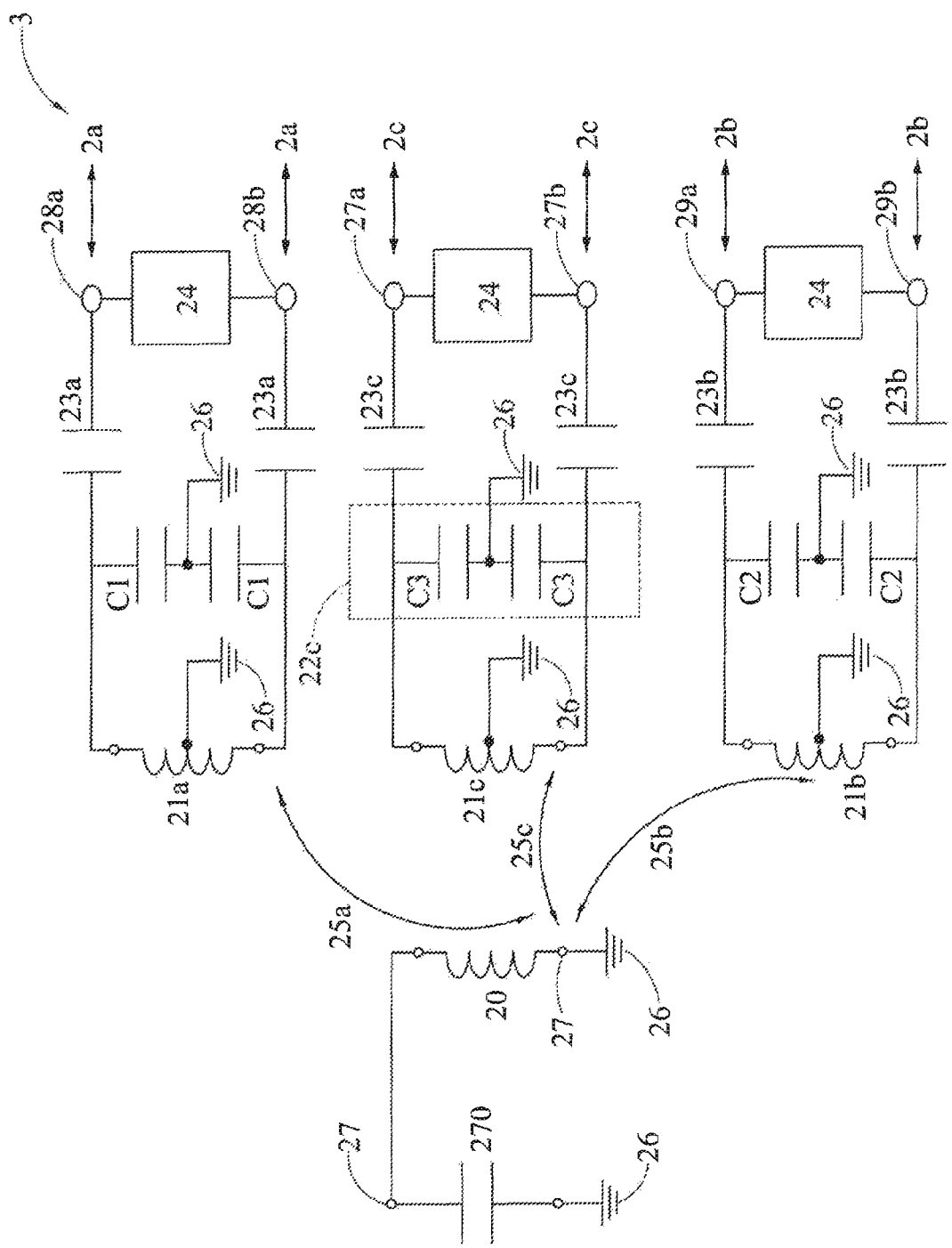
FIG. 4A is a circuit diagram of another embodiment of a multi bandwidth balun according to the present invention.
Figure 4B:
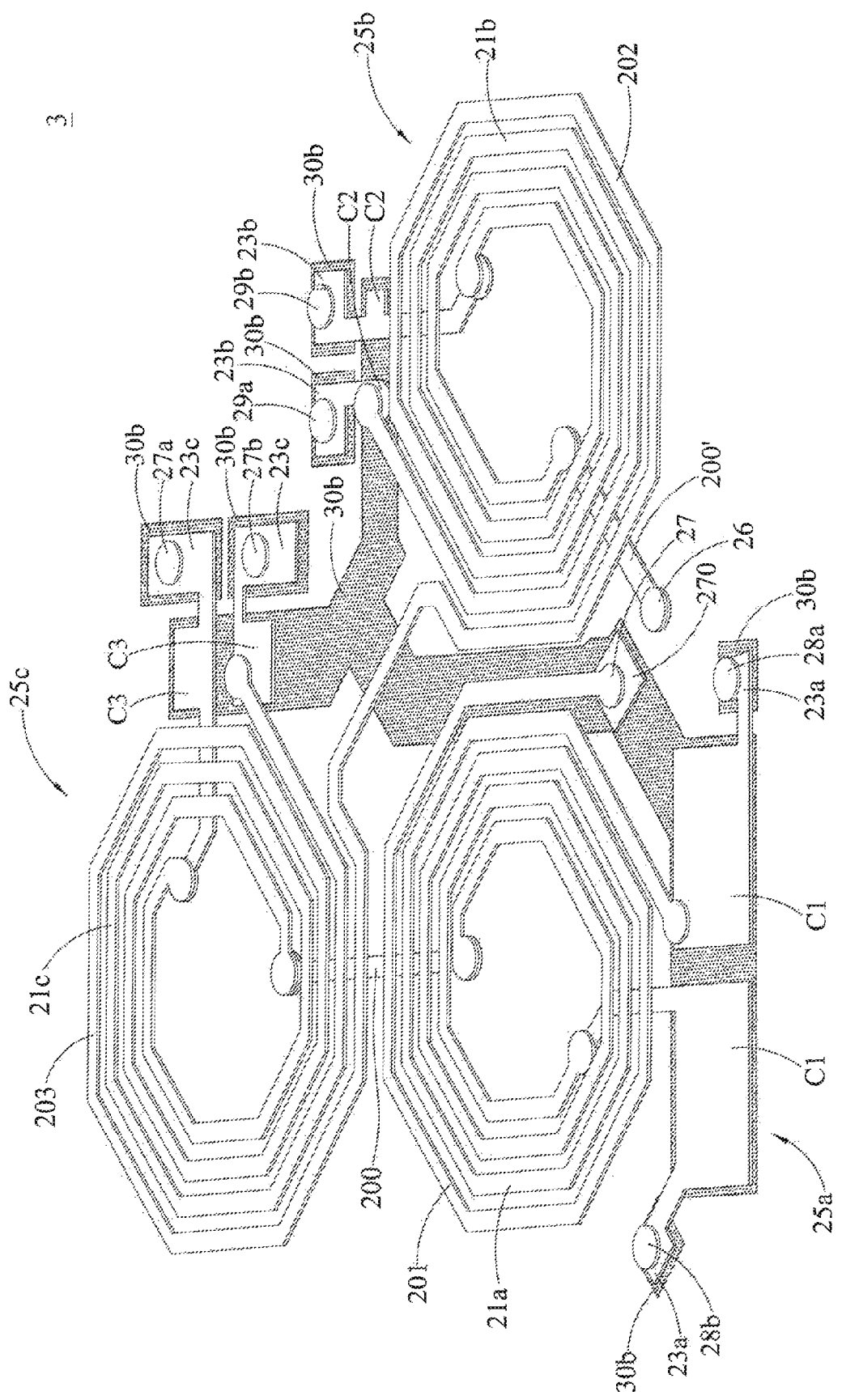
FIG. 4B is a perspective view of the circuit structure of FIG. 4A.

FIGS. 4A and 4B illustrate another embodiment of a multi bandwidth balun 3 according to the present invention. The embodiment differs from the above-mentioned embodiment only in an additional mid-frequency conversion path 2c.

As shown in FIG. 4A, the balun 3 further comprises a third inductor 21c, a third capacitor module 22c (including two third capacitors C3), a third main capacitor 23c and two third signal ports 27a and 27b.

In an embodiment, the balun 3 has a low frequency conversion path 2a (the main inductor 20, the first inductor 21a, the first capacitor module 22a and the first main capacitors 23a), a high frequency conversion path 2b (the main inductor 20, the second inductor 21b, the second capacitor module 22b and the second main capacitor 23b) and a mid-frequency conversion path 2c (the main inductor 20, the third inductor 21c, the third capacitor module 22c and the third main capacitor 23c).

As shown in FIG. 4B, in the circuit structure of the balun 3 the first patterned circuit 31b further includes another extension portion 200', a third capacitor module 22c and a third main capacitor 23c, and the second patterned circuit 32b further includes a third inductor 21c, two third signal ports 27a and 27b and a third coil 203.

Moreover, the main inductor 20 is constituted by the first coil 201, the extension portion 200, the second coil 202 and the third coil 203, wherein the extension portion 200 connects the first coil 201 to third coil 203 through conductive vias, and the second coil 202 is integrated with the third coil 203.

Further, one end of the first coil 201 is a main signal port 27 (which is connected to an additional capacitor 270 through conductive vias), and one end of the second coil 202 is connected to a ground port 26 of the main signal port 27 through another extension portion 200'.

Figure 7:
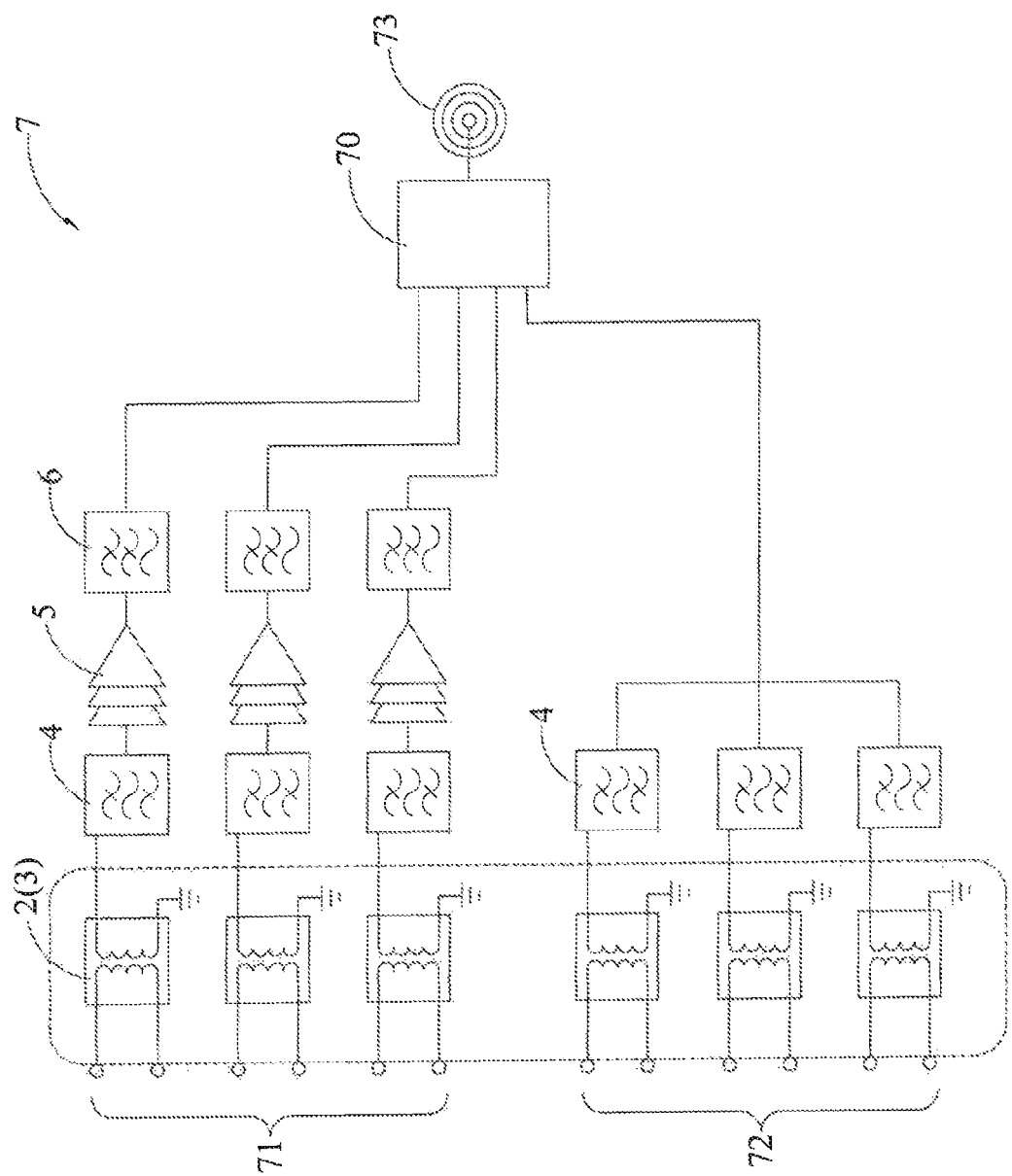
FIG. 7 is a circuit diagram of the applications of multi bandwidth baluns according to the present invention.

FIG. 7 is a circuit diagram of the applications of multi bandwidth baluns 2 and 3 according to the present invention. In an embodiment, the baluns 2 and 3 are utilized in a worldwide interoperability for microwave access (WiMAX) system 7, which is a high speed Wi-Fi system applicable to a wireless access point device, wireless router, wireless network card, 3G system or 4G system, and portable electronic products such as cell phone, tablet computer, etc.

As shown in FIG. 7, the WiMAX system 7 comprises: an antenna 73, an RF switch 70 electrically connected to the antenna 73, three sets of signal transmitting terminals 71 electrically connected to the RF switch 70, three sets of signal receiving terminals 72 electrically connected to the RF switch, a harmonic filter 6, a filter 4, an amplifier 5 and the baluns 2 and 3.

In an embodiment, the WiMAX system 7 is multifunctional, and the RF switch is SP4T.

Moreover, the signal transmitting terminals 71 and signal receiving terminals 72 have transmitting frequency 2G (i.e., 2.5 GHz), 3G (i.e., 3.5 GHz) and 5G (i.e., 5.5 GHz), respectively. However, the WiMAX system 7 receives any frequency and is not limited by the description above.

The harmonic filter 6, the amplifier 5 and the filter 4 are electrically connected between the RF switch 70 and the signal transmitting terminals 71, and the harmonic filter 6, the amplifier 5 and filter 4 are also electrically connected between the RF switch 70 and the signal receiving terminals 72.

In addition, the baluns 2 and 3 are electrically connected between the harmonic filter 6 and the signal transmitting terminals 71, and electrically connected between the harmonic filter 6 and the signal receiving terminals 72. Specifically, the main signal port is electrically connected to the harmonic filter 6, and the first and second signal ports 28a, 28b, 29a and 29b (or third signal ports 27a and 27b) are electrically connected to the signal transmitting terminals 71 and the signal receiving terminals 72.

In summary, the balun and circuit structure thereof according to the present invention replace the electrically matched network according to the prior art by the design of mutual inductance and multi layers stacking technology, such that reducing the volume of a semiconductor element.

The above embodiments only exemplarily specify the concept and effect of the present invention, but not intend to limit the present invention. Any person skilled in the art can perform modifications and adjustments on the above embodiments without departing the spirit and category of the present invention.

What is claimed is:

1. A circuit structure of a multi bandwidth balun, comprising:
a first circuit layer including a first capacitor module, a first main capacitor, a second capacitor module, and a second main capacitor; and
a second circuit layer disposed on the first circuit layer, the second circuit layer including:
a first main signal port;
a main inductor electrically connected to the main signal port;
a first inductor inducted mutually with the main inductor to constitute a first conversion circuit connected in parallel to the first capacitor module;
two first signal ports electrically connected to the first capacitor module, wherein the first main capacitor is electrically connected to the first signal ports and the first capacitor module therebetween;
a second inductor inducted mutually with the main inductor to constitute a second conversion circuit connected in parallel to the second capacitor module; and
two second signal ports electrically connected to the second capacitor module, wherein the second main capacitor is electrically connected to the second signal port and the second capacitor module therebetween.

2. The circuit structure of claim 1, wherein an impedance load is connected between the two first signal ports.

3. The circuit structure of claim 1, wherein an impedance load is connected between the two second signal ports.

4. The circuit structure of claim 1, wherein the main signal port is an input port, and the first signal port and the second signal port are output ports.

5. The circuit structure of claim 1, wherein the main signal port is an output port, and the first signal port and the second signal port are input ports.

6. The circuit structure of claim 1, wherein the main inductor is constituted by a first coil, an extension portion and a second coil, and the extension portion is connected to the first coil and the second coil.

7. The circuit structure of claim 6, wherein the first circuit layer further includes the extension portion, and the second circuit layer further includes the first coil and the second coil.

8. The circuit structure of claim 7, wherein the second circuit layer has conductive vias that electrically connect the first coil to the extension portion and electrically connect the second coil to the extension portion.

9. The circuit structure of claim 1, further comprising a ground port connected to the main inductor, the first inductor, the first capacitor module, the second inductor, and the second capacitor module.

10. The circuit structure of claim 1, further comprising a plurality of conductive vias that connect the first circuit layer to the second circuit layer, wherein the conductive vias electrically connect the first inductor and the second inductor to the first capacitor module and the second capacitor module, respectively.

11. The circuit structure of claim 1, further comprising a base layer carrying the first circuit layer, the base layer having a plurality of electrodes corresponding to the main signal port, the first capacitor module, the second capacitor module, the first main capacitor, the second main capacitor, the first signal port and the second signal port respectively.

12. The circuit structure of claim 11, further comprising conductive through holes that connect the base layer and first circuit layer, wherein the conductive vias electrically connect the electrode to the main signal port, electrically connect the electrode to the first signal port, and electrically connect the electrode to the second signal port.

13. The circuit structure of claim 1, wherein the first circuit layer further comprises a third capacitor module and a third main capacitor, the second circuit layer further includes a third inductor and two third signal ports, the third inductor is inducted mutually with the main inductor to constitute a third conversion circuit, the third capacitor module is connected in parallel to the third conversion circuit, the two third signal ports are electrically connected to the third capacitor module, and the third main capacitor is electrically connected to the third signal port and the third capacitor module therebetween.

14. The circuit structure of claim 13, wherein the main inductor is constituted by a first coil, an extension portion, a second coil and a third coil, the extension portion connects the first coil to the third coil, and the second coil is integrated with the third coil.

15. The circuit structure of claim 14, wherein the first circuit layer further comprises the extension portion, and the second circuit layer further comprises the first coil, the second coil, and the third coil.

16. A balun, comprising:
a main signal port;
a main inductor electrically connected to the main signal port;
a first inductor inducted mutually with the main inductor to constitute a first conversion circuit;
a first capacitor module connected in parallel to the first conversion circuit;
two first signal ports electrically connected to the first capacitor module;
a first main capacitor electrically connected to the first signal port and the first capacitor module therebetween;
a second inductor inducted mutually with the main inductor to constitute a second conversion circuit;
a second capacitor module connected in parallel to the second conversion circuit;
two second signal ports electrically connected to the second capacitor module; and
a second main capacitor electrically connected to the second signal port and the second capacitor module therebetween.

17. The balun of claim 16, wherein the main signal port is an input port, and the first signal port and the second signal port are output ports.

18. The balun of claim 16, wherein the main signal port is an output port, and the first signal port and the second signal port are input ports.

19. The balun of claim 16, wherein an impedance load is connected between the two first signal ports.

20. The balun of claim 16, wherein an impedance load is connected between the two second signal ports.

21. The balun of claim 16, further comprising a ground port connected to the main inductor, the first inductor, the first capacitor module, the second inductor and the second capacitor module.

22. The balun of claim 16, further comprising:
a third inductor inducted mutually with the main inductor to constitute a third conversion circuit;
a third capacitor module connected in parallel to the third conversion circuit;
two third signal ports electrically connected to the third capacitor module; and
a third main capacitor electrically connected to the third signal port and the third capacitor module therebetween.

23. A wireless network system, comprising:
an antenna;
a radio frequency (RF) converter electrically connected to the antenna;
a signal transmitting terminal electrically connected to the RF converter;
a signal receiving terminal electrically connected to the RF converter;
a filter electrically connected between the RF converter and the signal transmitting terminal and connected between the RF converter and the signal receiving terminal; and
a balun of claim 16 electrically connected between the filter and the signal transmitting terminal and electrically connected between the filter and the signal receiving terminal, wherein the main signal port is electrically connected to the filter, and the first and second signal ports are electrically connected to the signal transmitting terminal and the signal receiving terminal.

24. The wireless network system of claim 23, wherein the main signal port is an input port, and the first signal port and the second signal port are output ports.

25. The wireless network system of claim 23, wherein the main signal port is an output port, and the first signal port and the second signal port are input ports.

26. The wireless network system of claim 23, wherein an impedance load is connected between the two first signal ports.

27. The wireless network system of claim 23, wherein an impedance load is connected between the two second signal ports.

28. The wireless network system of claim 23, further comprising a ground port connected to the main inductor, the first inductor, the first capacitor module, the second inductor, and the second capacitor module.

29. The wireless network system of claim 23, further comprising:
a third inductor inducted mutually with the main inductor to constitute a third conversion circuit;
a third capacitor module connected in parallel to the third conversion circuit;
two third signal ports electrically connected to the third capacitor module; and
a third main capacitor electrically connected to the third signal port and the third capacitor module therebetween.

30. The wireless network system of claim 29, wherein the third signal port is electrically connected to the signal transmitting terminal and the signal receiving terminal.

* * * * *